US011332087B2

(12) United States Patent
Young et al.

(10) Patent No.: US 11,332,087 B2
(45) Date of Patent: May 17, 2022

(54) PHASE MODULE ASSEMBLY OF A MULTI-PHASE INVERTER

(71) Applicant: Westinghouse Air Brake Technologies Corporation, Pittsburgh, PA (US)

(72) Inventors: Henry Todd Young, Erie, PA (US); Fabio Carastro, Munich (DE); Mark Murphy, Erie, PA (US); Jason Kuttenkuler, Erie, PA (US); Alvaro Jorge Mari Curbelo, Oberschleissheim (DE)

(73) Assignee: Westinghouse Air Brake Technologies Corporation, Pittsburgh, PA (US)

( * ) Notice: Subject to any disclaimer, the term of this patent is extended or adjusted under 35 U.S.C. 154(b) by 155 days.

(21) Appl. No.: 16/429,797

(22) Filed: Jun. 3, 2019

(65) Prior Publication Data
US 2019/0372473 A1    Dec. 5, 2019

Related U.S. Application Data

(60) Provisional application No. 62/680,265, filed on Jun. 4, 2018.

(51) Int. Cl.
  *H02M 7/00* (2006.01)
  *H02G 5/00* (2006.01)
  (Continued)

(52) U.S. Cl.
  CPC ......... *B60R 16/0231* (2013.01); *H02M 7/003* (2013.01); *H01G 4/38* (2013.01);
  (Continued)

(58) Field of Classification Search
  CPC ..... B60R 17/0231; H02M 7/003; H02M 7/48; H01G 4/38; H02G 5/005; H05K 7/1432
  See application file for complete search history.

(56) References Cited

U.S. PATENT DOCUMENTS

| 4,399,321 A | 8/1983 | Gottlieb |
| 4,436,953 A | 3/1984 | Gottlieb |

(Continued)

FOREIGN PATENT DOCUMENTS

| CN | 109412431 A | * | 3/2019 |
| CN | 107070256 B | * | 6/2019 |

OTHER PUBLICATIONS

SEB Inc. PCIM Paper Presentation: 20% Increase in Inverter Efficiency Seen with Integrated DC Link Capacitor/BUS (2 pages).

*Primary Examiner* — Fred E Finch, III
(74) *Attorney, Agent, or Firm* — Philip S. Hof

(57) ABSTRACT

A phase module assembly includes a first flat laminated busbar elongated along a first direction, including a positive layer, a negative layer, and a load layer that is configured to be conductively coupled with a load. The first flat laminated busbar is conductively coupled to a second flat laminated busbar extending in a plane that is orthogonal to the first direction. The second flat laminated busbar is conductively coupled with a power source of direct current. The phase module assembly also includes one or more switches conductively coupled with internal terminal connectors of the first flat laminated busbar and configured to convert the direct current into one phase of a multi-phase alternating current, and to output the phase to the load. The phase module assembly also includes one or more capacitors mechanically mounted on and conductively coupled with the second flat laminated busbar.

20 Claims, 6 Drawing Sheets

(51) Int. Cl.
*H01G 4/38* (2006.01)
*H02M 7/48* (2007.01)
*B60R 16/023* (2006.01)
*H02M 7/537* (2006.01)
*H02G 5/10* (2006.01)
*H05K 7/20* (2006.01)

(52) U.S. Cl.
CPC ............... *H02G 5/005* (2013.01); *H02G 5/10* (2013.01); *H02M 7/48* (2013.01); *H02M 7/537* (2013.01); *H05K 7/209* (2013.01); *H05K 7/20854* (2013.01)

(56) References Cited

U.S. PATENT DOCUMENTS

| | | | |
|---|---|---|---|
| 5,142,439 | A | 8/1992 | Huggett et al. |
| 6,160,696 | A * | 12/2000 | Bailey ................... H02M 7/003 361/100 |
| 8,112,853 | B2 | 2/2012 | Yoshinaga et al. |
| 2009/0040724 | A1 * | 2/2009 | Nishikimi ........... H02M 7/5387 361/699 |
| 2010/0089641 | A1 * | 4/2010 | Esmaili ................ H05K 7/1432 174/70 B |
| 2014/0085955 | A1 * | 3/2014 | Maeda ................ H02M 7/5387 363/132 |
| 2016/0294301 | A1 * | 10/2016 | Yokoyama ......... H05K 7/20927 |
| 2017/0207763 | A1 * | 7/2017 | Li ........................... H02P 29/50 |
| 2017/0257039 | A1 * | 9/2017 | Namou ................. H02M 7/537 |
| 2019/0140552 | A1 * | 5/2019 | Kneller ................... H02P 27/06 |
| 2019/0320549 | A1 * | 10/2019 | Song ................... H05K 7/1432 |
| 2020/0091686 | A1 * | 3/2020 | Yang ....................... B64D 33/00 |
| 2020/0337168 | A1 * | 10/2020 | Kuttenkuler ......... H02K 11/046 |

\* cited by examiner

PHASE MODULE ASSEMBLY OF A MULTI-PHASE INVERTER

CROSS-REFERENCE TO RELATED APPLICATIONS

This application claims priority to U.S. Provisional Patent Application No. 62/680,265, which was filed on 4 Jun. 2018, and the entire disclosure of which is incorporated herein by reference.

FIELD

Embodiments of the subject matter disclosed herein generally relate to inverters.

BACKGROUND

Inverters convert direct current (DC) into alternating current (AC). Some inverters include multiple phase modules that each convert a portion of the DC into a different phase of the AC. For example, some inverters include three phase modules that each create a different phase of AC (for 3-phase AC power).

Some power systems include inverters that power significant loads. For example, some vehicles may include inverters that power traction motors that propel the vehicles. These inverters generate heat during operation, and known inverters are air cooled, having either capacitors integrated into standalone inverter modules or a bank of capacitors connected to a laminated bus structure (which then connects to phase modules to form the inverter). In either situation, the capacitors are fitted with separation caps that take up significant volume and weight. Additionally, the busbars of these systems take up significant volume and weight.

BRIEF DESCRIPTION

In one or more embodiments, a phase module assembly of a multi-phase inverter is provided. The phase module assembly includes a first flat laminated busbar, one or more switches, and one or more capacitors. The first flat laminated busbar is elongated along a first direction and includes a positive layer, a negative layer, and a load layer that is configured to be conductively coupled with a load. The first flat laminated busbar includes internal positive and negative terminal connectors. The first flat laminated busbar is conductively coupled to a second flat laminated busbar that extends in a plane that is orthogonal to the first direction. The second flat laminated busbar includes external positive and negative bushings configured to be conductively coupled with a power source of direct current. The internal positive and negative terminal connectors are conductively coupled with the external positive and negative bushings via the first and second flat laminated busbars to receive the direct current from the power source. The one or more switches are conductively coupled with the internal positive and negative terminal connectors and configured to convert the direct current into one phase of a multi-phase alternating current of the multi-phase inverter, and to output the phase of the multi-phase alternating current to the load. The one or more capacitors are mechanically mounted on the second flat laminated busbar and conductively coupled with the internal positive and negative terminal connectors and with the external positive and negative bushings.

In one or more embodiments, an inverter stack assembly is provided that includes a first multi-phase inverter assembly, a first DC link busbar, a second multi-phase inverter assembly, and a second DC link busbar. The first multi-phase inverter assembly includes multiple phase module assemblies arranged in a stack. The first multi-phase inverter assembly is configured to convert direct current into a multi-phase alternating current and to output the multi-phase alternating current to a load. The first DC link busbar extends across the first multi-phase inverter assembly and is separately conductively coupled to each of the phase module assemblies in the first multi-phase inverter assembly. The first DC link busbar is configured to be conductively coupled to a power source of direct current. The first DC link busbar includes one or more capacitors mechanically mounted thereon and configured to supply the direct current received from the power source to the first multi-phase inverter assembly. The second multi-phase inverter assembly includes multiple phase module assemblies arranged in a stack. The second multi-phase inverter assembly is configured to convert direct current into a multi-phase alternating current and to output the multi-phase alternating current to the load or to another load. The second DC link busbar extends across the second multi-phase inverter assembly and is separately conductively coupled to each of the phase module assemblies in the second multi-phase inverter assembly. The second DC link busbar is configured to be conductively coupled to the power source of direct current. The second DC link busbar includes one or more capacitors mechanically mounted thereon and configured to supply the direct current to the second multi-phase inverter assembly. The first DC link busbar is conductively coupled to the second DC link busbar.

In one or more embodiments, a multi-phase inverter assembly is provided that includes a first phase module assembly, a second phase module assembly, and a DC link busbar. The DC link busbar extends across the first and second phase module assemblies and separately conductively couples to both the first and second phase module assemblies to supply direct current from a power source to the first and second phase module assemblies. Each of the first and second phase module assemblies includes a first laminated busbar, a second laminated busbar, one or more insulated gate bipolar transistors, and one or more capacitors. The first laminated busbar is elongated along a first direction and is configured to be conductively coupled with a load. The first laminated busbar includes internal terminal connectors. The second laminated busbar is elongated orthogonal to the first direction. The second laminated busbar is conductively coupled to the first flat laminated busbar and is configured to be conductively coupled with the power source such that direct current from the power source is conveyed to the first laminated busbar through the second laminated busbar. The one or more insulated gate bipolar transistors are conductively coupled with the internal terminal connectors of the first laminated busbar. The one or more insulated gate bipolar transistors are configured to convert the direct current received from the power source through the second laminated busbar into one corresponding phase of a multi-phase alternating current, and to output the phase of the multi-phase alternating current to the load through the first laminated busbar. The one or more capacitors are mechanically mounted on and conductively coupled to the second laminated busbar.

BRIEF DESCRIPTION OF THE DRAWINGS

The presently described subject matter will be better understood from reading the following description of non-limiting embodiments, with reference to the attached drawings, wherein below.

DETAILED DESCRIPTION

The inventive subject matter described herein provides a compact and lightweight air-cooled traction inverter system for loads such as heavy-duty vehicles. The inverters described herein can utilize capacitors that are integrated into a laminated busbar to form the DC link for a set of phase module assemblies of the inverter, which can be configured to make up two or more inverter and/or chopper functions. The phase module assemblies provide low commutation inductance and achieve high power density for a multiple inverter structure connected to a distributed DC link arrangement, while remaining reliable. The phase module assemblies described herein also can improve switching performances of silicon (Si) and silicon carbide (SiC) high-power modules used in high power drives and grid connected power inverters.

Figures 1, 2:
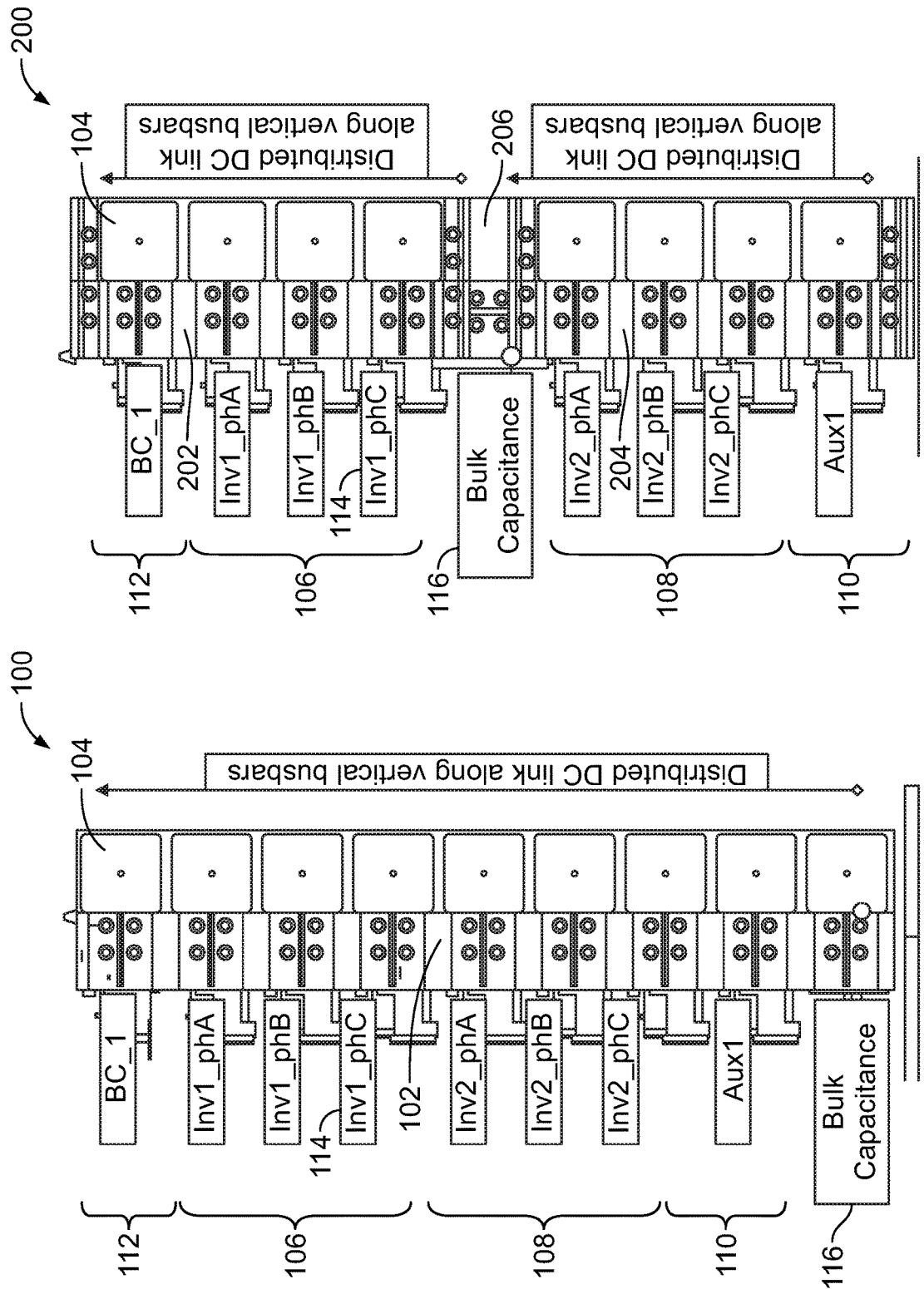
FIG. 1 is a schematic illustration of one embodiment of an inverter stack assembly.
FIG. 2 is a schematic illustration of another embodiment of an inverter stack assembly.

FIG. 1 is a schematic illustration of one embodiment of an inverter stack assembly 100. The inverter stack assembly 100 includes a single DC link busbar 102 with integrated capacitors 104. The inverter stack assembly 100 can be used in a powered system, such as a vehicle, to power loads such as traction motors. The inverter stack assembly 100 includes the single DC link busbar 102 with nine integrated capacitors 104 that supply two multi-phase inverter assemblies 106, 108, an auxiliary inverter assembly 110 ("Aux1" in FIG. 1), and a chopper 112 ("BC_1" in FIG. 1). Each of the inverter assemblies 106, 108 can be a three-phase inverter with plural (e.g., three) phase module assemblies 114.

The phase module assembly 114 of the first inverter assembly 106 that is labeled Inv1_phA can produce a first phase of AC to a first load (e.g., a traction motor), the phase module assembly 114 of the first inverter assembly 106 that is labeled Inv1_phB can produce a second phase of AC to the first load, and the phase module assembly 114 of the first inverter assembly 106 that is labeled Inv1_phC can produce a third phase of AC to the first load. Similarly, the phase module assembly 114 of the second inverter assembly 108 that is labeled Inv2_phA can produce a first phase of AC to a second load (e.g., another traction motor), the phase module assembly 114 of the second inverter assembly 108 that is labeled Inv2_phB can produce a second phase of AC for the second load, and the phase module assembly 114 of the second inverter assembly 108 that is labeled Inv2_phC can produce a third phase of AC for the second load.

The chopper 112 may be a brake chopper of a vehicle. The auxiliary inverter assembly 110 may generate AC for loads that do work other than propelling the vehicle. A bulk capacitor 116 optionally can be included to increment the total capacitance and current capability of the stack of inverter assemblies 106, 108. The bulk capacitor 116 can be one or more capacitors that are conductively coupled with multiple phase module assemblies 114 and/or are connected across the DC supply lines of one or more (or all) of the inverter assemblies 106, 108, 110.

FIG. 2 is a schematic illustration of another embodiment of an inverter stack assembly 200. The inverter stack assembly 200 includes two DC link busbars 202, 204 that are connected by a joining busbar 206. The joining busbar 306 is a discrete busbar that conductively couples to each of the two DC link busbars 202, 204. The two DC link busbars are spaced apart from each other and are conductively coupled to each other via the joining busbar 206. The DC link busbar 202 is separately conductively coupled to the phase module assemblies 114 of the first inverter assembly 106. For example, the DC link busbar 202 extends across the phase module assemblies 114 of the inverter assembly 106 and connects to each phase module assembly 114 at a different corresponding location along the length of the busbar 202. Similarly, the DC link busbar 204 is separately conductively coupled to the phase module assemblies 114 of the second inverter assembly 106. Each of the DC link busbars 202, 204 includes four integrated capacitors 104 that supply DC current to the inverter assemblies 106, 108, the auxiliary inverter assembly 110, and the chopper 112. The bulk capacitor 116 is located between the inverter assemblies 106, 108 and between the busbars 202, 204, and is connected to the busbars 202, 204 using a low inductive laminated connection. The bulk capacitor 116 also provides an electrical link to the busbars 202, 204. Optionally, the busbars 202, 204 may be vertically oriented and/or vertically stacked. For example, the busbar 202 and the inverter assembly 106 may be disposed above the busbar 204 and the inverter assembly 108 in a vertical stack.

The inverter stack assembly 200 may have several improvements over the inverter stack assembly 100 shown in FIG. 1, such by being more modular (additional phase module assemblies 114 can be easily attached to the busbars 202, 204), being easier to manufacture (e.g., due to the modular nature), being easier to transport (e.g., due to the modular nature, the inverter stack assembly 200 may be taken apart and re-assembled more easily), being more light-weight, and having a simpler assembly process.

Figure 3:
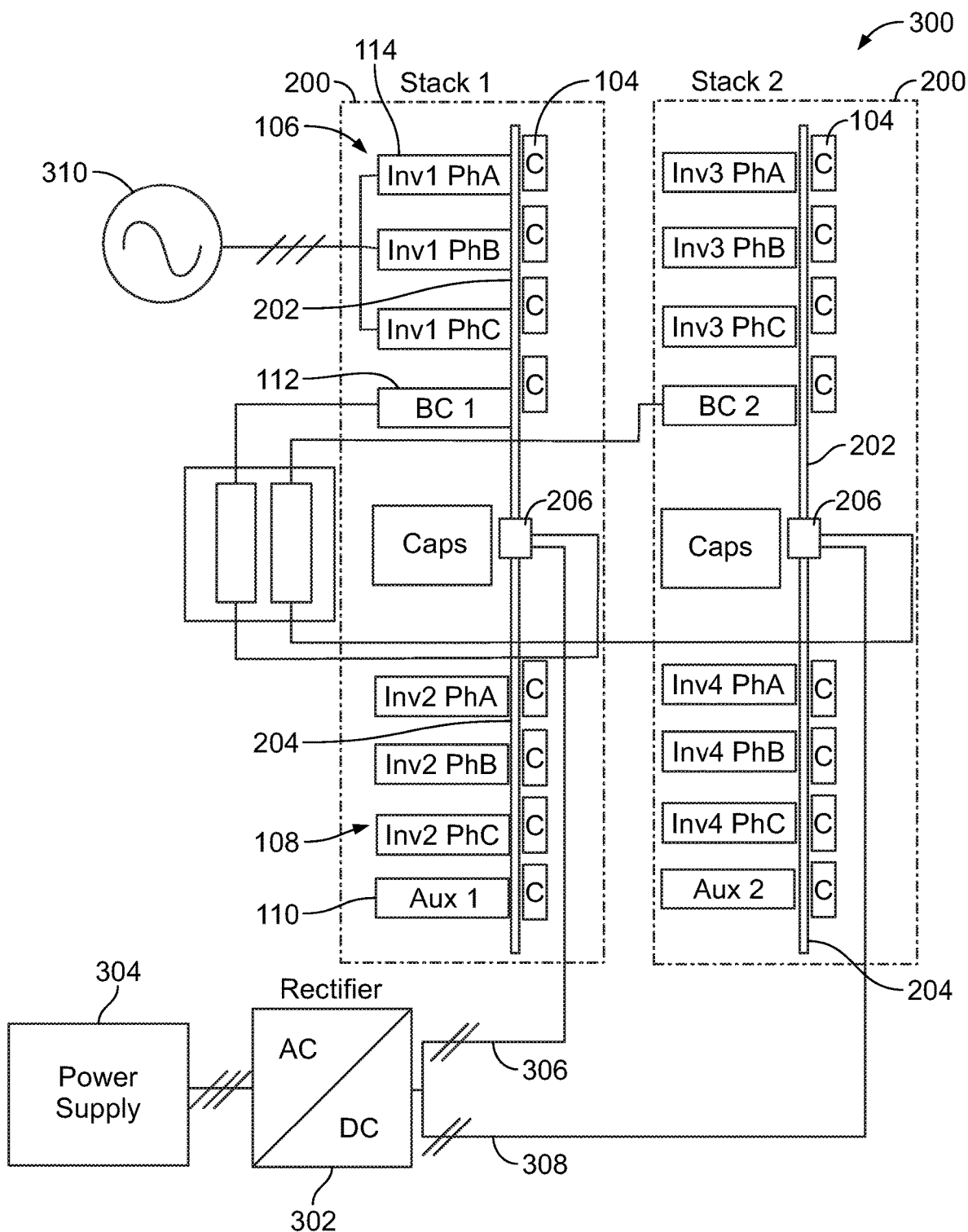
FIG. 3 illustrates a circuit diagram of a power supply system.

FIG. 3 illustrates a circuit diagram of a power supply system 300. The power supply system 300 includes two of the inverter stack assemblies 200 ("Stack 1" and "Stack 2" in FIG. 3). A rectifier 302 is fed from a multi-phase AC power supply 304, such as a synchronous generator (not shown) or another type of power supply. The power supply 304 provides a three phase AC current in the illustrated embodiment, but optionally can provide another AC current having at least two phases. The output of the rectifier 302 is DC current, such that the rectifier 302 is a power source of direct current. The rectifier output (which could be a diode bridge or another component) is split into two sets of DC+/DC− feeding points 306, 308, each of which supplies an inverter stack assembly 200. Each of the inverter stack assemblies 200 includes the laminated busbars 202, 204, the inverter assemblies 106, 108, and the joining busbar 206. The inverter stack assemblies 200 are represented as vertical columns or stacks in FIG. 3. Horizontal dispositions and variations are possible as well. The interconnection elements between the output and the rectifier 302 could be pair of cables or busbars. For example, each inverter stack assembly 200 may receive direct current from the rectifier 302 via one or more cables that connect to the joining busbar 206. The direct current received at the joining busbar 206 may be distributed in different portions to the two DC link busbars 202, 204. The two stacks are receptacles for a number of the phase module assemblies 114. The phase module assemblies 114 can receive the DC current from the busbars 202, 204.

In the illustrated embodiment, the multiple (e.g., three) phase AC that is output by at least one of the inverter assemblies (e.g., the inverter assembly 106 in FIG. 3, but optionally can be another inverter assembly 106) can be provided to a load 310, such as a traction motor of a vehicle or another load. This multi-phase AC that is output to the load 310 can power the load 310, such as by powering the motor to generate tractive effort at a wheel, axle, or the like, of the vehicle.

Each inverter stack assembly 200 in FIG. 3 holds eight phase module assemblies 114, represented to the left of the respective stack assembly 200. The phase module assemblies 114 are arranged in two sets of three contiguous phase module assemblies 114, which together form a three-phase inverter assembly 106, 108. The left stack assembly 200 is capable of feeding two three-phase AC loads 310, such as motors. There are two additional positions for housing phase module assemblies in positions four (where the chopper 112 is located) and eight (where the auxiliary inverter assembly 110 is located) counting from the top.

In the illustrated embodiment, the phase module assembly 114 forming the chopper 112 in position four holds switches used to transfer power to a resistor (e.g., a grid box block), which can be used, for example, during braking of a vehicle or when excess voltage transiently appears in the system 300 and needs to be quickly dissipated. The phase module assembly 114 forming the auxiliary inverter assembly 110 in position eight can be used for an auxiliary function, such as driving another brake resistor, generating part of a chopped waveform to create a secondary bus at a different voltage level to feed additional inverter assemblies (not shown) used to drive auxiliary loads, or the like. Although eight phase module assemblies 114 are shown in each stack 200, more could be used in one or more of the stacks 200. In the illustrated embodiment, the two stacks 200 together allow up to four independent loads (e.g., motors) to be powered, such as traction motors of a four-wheeled vehicle.

Figure 4:
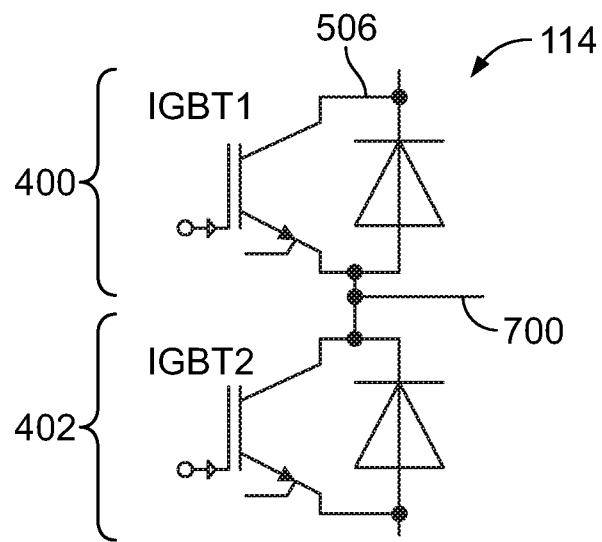
FIG. 4 illustrates a circuit diagram of one embodiment of a phase module assembly shown in FIGS. 2 and 3.
Figure 5:
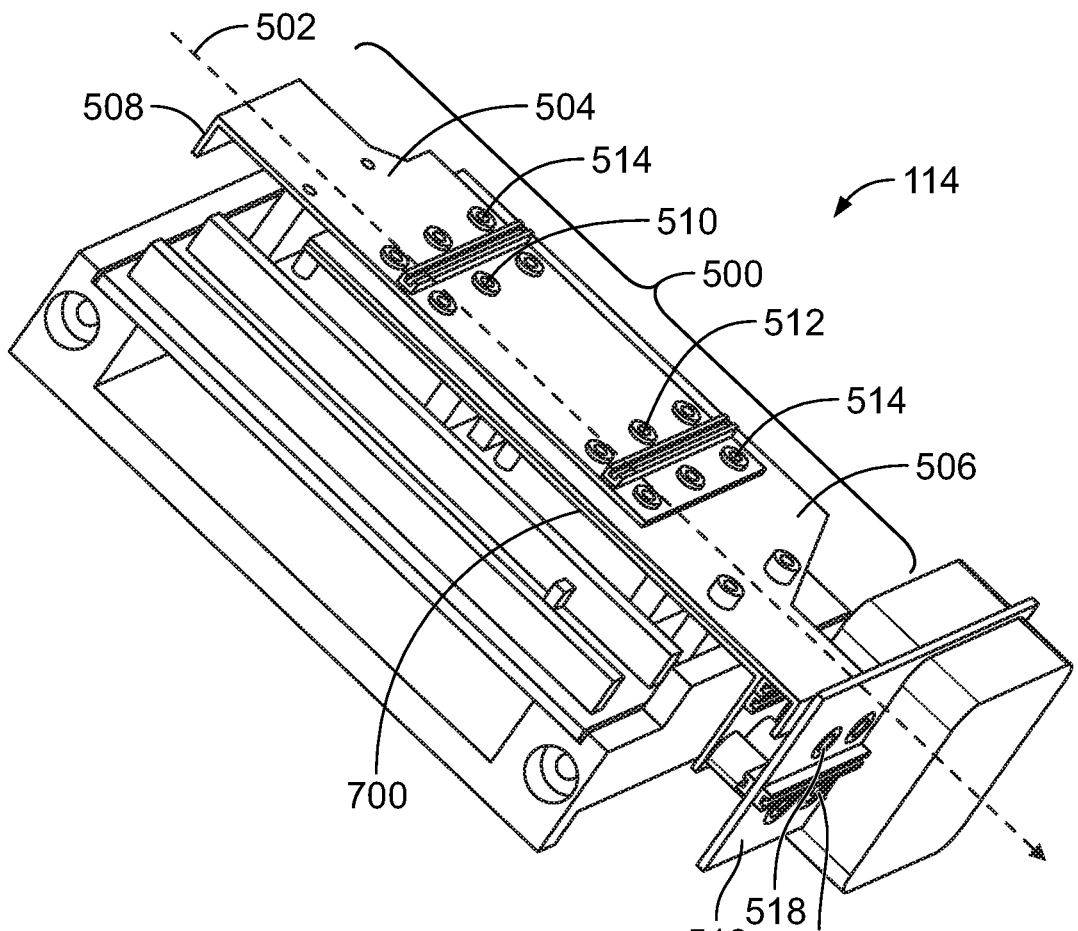
FIG. 5 illustrates a perspective view of one embodiment of the phase module assembly shown in FIGS. 2 through 4.

FIG. 4 illustrates a circuit diagram of one embodiment of the phase module assembly 114 shown in FIGS. 2 and 3. FIG. 5 illustrates a perspective view of one embodiment of the phase module assembly 114 shown in FIGS. 2 through 4. The phase module assembly 114 includes a series connection of multiple (e.g., two) switches 400, 402 ("IGBT1" and "IGBT2" in FIG. 4). Each switch 400, 402 can be a packaged insulative gate bipolar transistor (IGBT) with antiparallel diodes integrated in a housing, or another type of solid state, semiconductor-based device.

The phase module assembly 114 includes a first flat laminated busbar 500 that is elongated along a first direction 502. For example, the busbar 500 may be planar or substantially planar (e.g., at least 75% of the busbar 500 lies within the same two-dimensional plane), and may be longer in the first direction 502 than any other direction. The busbar 500 can be formed from several conductive layers (or plates) 504, 506, 700 that are laminated together, or may be formed as a single plate. As shown in FIG. 4, the layer 506 can operate as or be conductively coupled with the collector of the IGBT 400. The layer 700 can operate as or be conductively coupled with the emitter of the IGBT 400, and also with the collector of the IGBT 402. The layer 504 terminates in a downwardly bent conductive tab 508, which can be used to connect with a cable or other connection to the load 310 (such as a cable to a motor) to output the phase of the AC current created by the phase module assembly 114. As shown, the layers 504, 506, 700 at least partially overlap each other, but may not entirely overlap each other. The layer 504 is also referred to herein as a load layer, the layer 506 is also referred to herein as a positive layer, and the layer 700 is also referred to herein as a negative layer.

The busbar 500 includes internal positive and negative terminal connectors or bushings 510, 512 and phase output terminal connectors or bushings 514. The connectors 510, 512, 514 are coupled with components internal to the phase module assembly 114, such as different parts of the switches 400, 402 forming the phase module assembly 114.

The phase module assembly 114 includes a second flat laminated busbar 516 that is conductively coupled with the first flat busbar 500. The second flat busbar 516 extends in a plane that is orthogonal to the first direction 502 along which the first flat busbar 500 is elongated. The plane of the second flat busbar 516 may be orthogonal to the plane in which the first flat busbar 500 extends. For example, as shown in FIG. 5, the busbars 500, 516 may extend in perpendicular planes. In one embodiment, the phase module assembly 114 is oriented such that the second busbar 516 is oriented vertically while the first busbar 500 is oriented horizontally. The second busbar 516 can be referred to as a vertical busbar and the first busbar 500 can be referred to as a horizontal busbar in such an orientation.

The second busbar 516 includes external positive and negative bushings 518, 520. These bushings 518, 520 are configured to be conductively coupled with the power supply 304, such as by being coupled with the busbar 202 or 204 to receive the DC. The internal positive and negative terminal connectors 510, 512 are conductively coupled with the external positive and negative bushings 518, 520 via the busbars 500, 516 and other components of the assembly 114 (e.g., by conductive plates, traces, buses, or the like) so that the assembly 114 receives the DC from the power supply 304, converts the DC into one phase of the multi-phase AC, and outputs the phase of the multi-phase AC to the load 310 (e.g., via the tab 508). In the illustrated embodiment, the bushings 518, 520 are symmetrically arranged on different parts of the same surface or side of the vertical busbar 516 (e.g., top and bottom portions of the side that is visible in FIG. 5).

Figure 6:
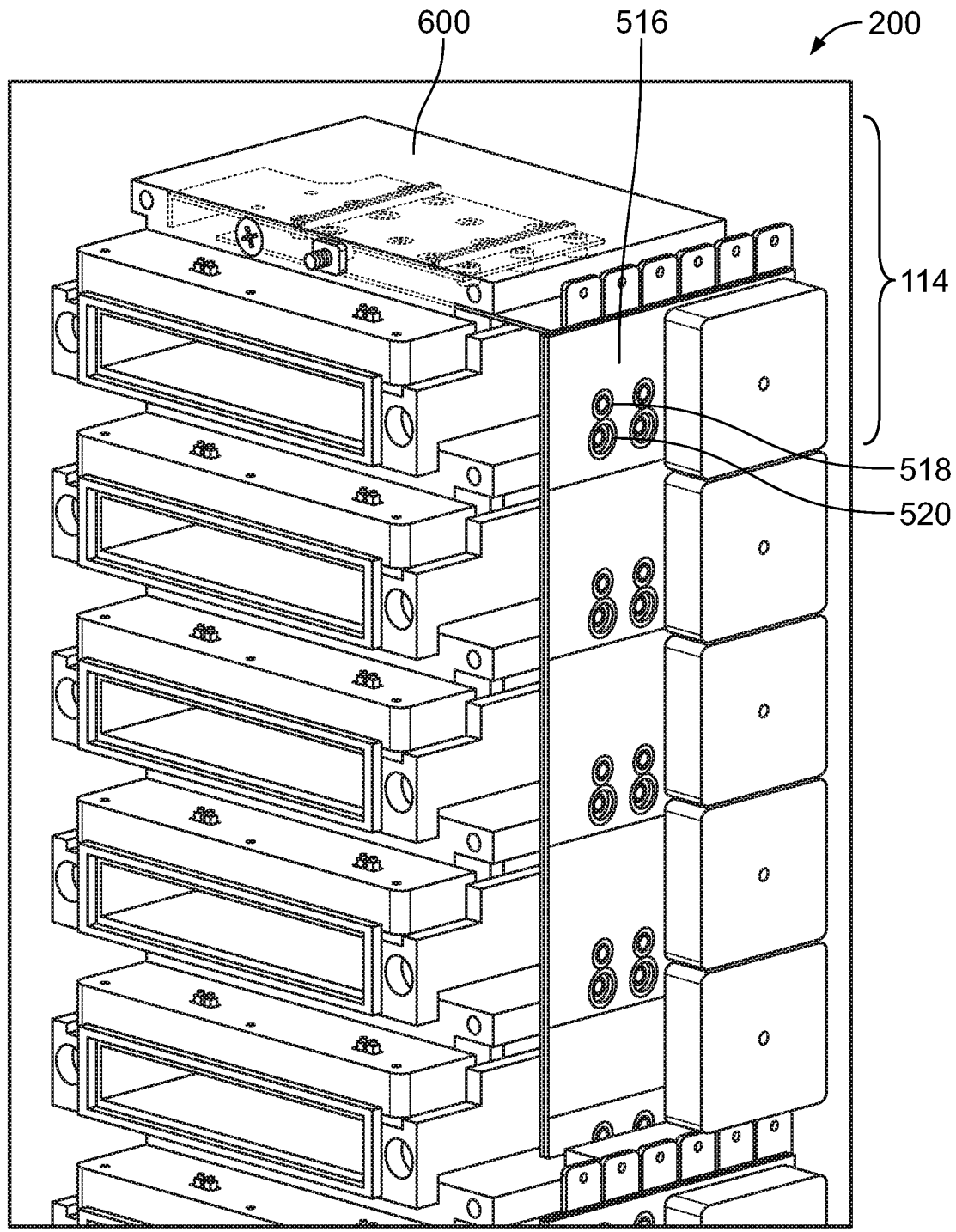
FIG. 6 illustrates a perspective view of the inverter stack assembly shown in FIG. 2.
Figure 7:
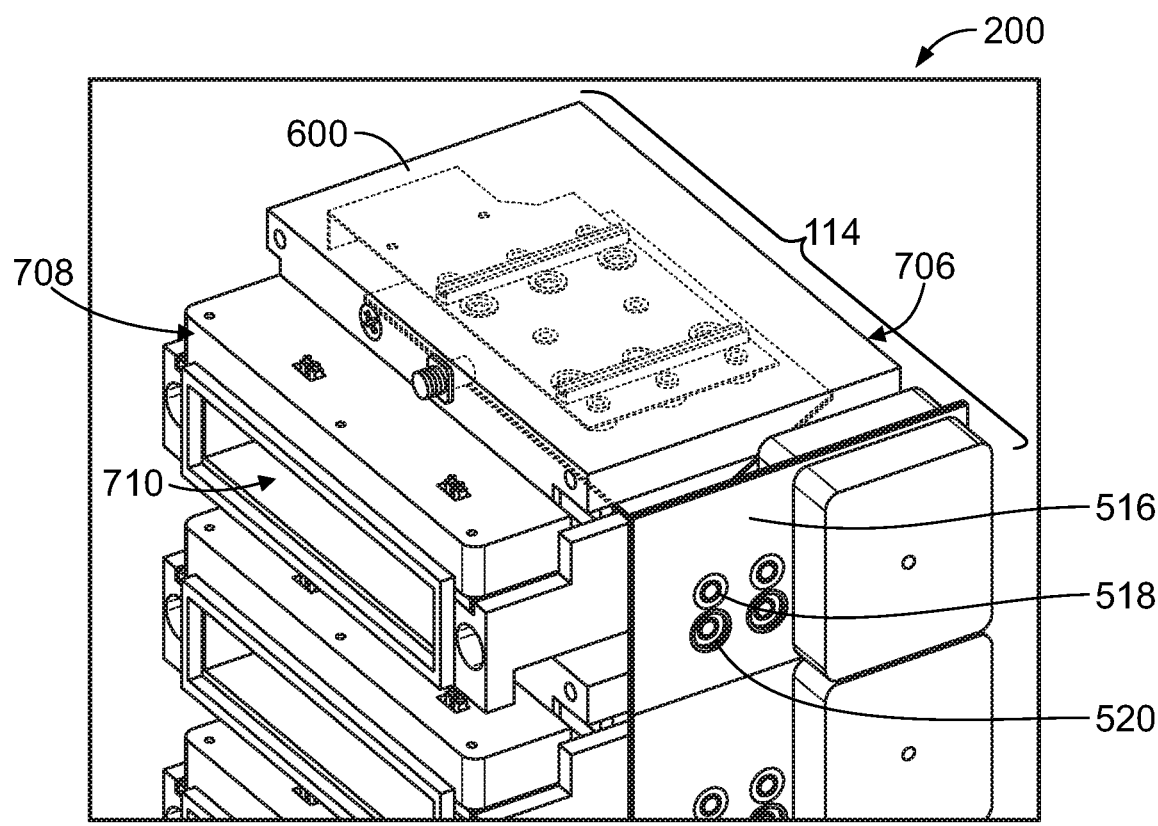
FIG. 7 illustrates a closer view of the top of the inverter stack assembly shown in FIG. 6.

With continued reference to the phase module assembly 114 shown in FIG. 5, FIG. 6 illustrates a perspective view of the inverter stack assembly 200 shown in FIG. 2, and FIG. 7 illustrates a closer view of the top of the inverter stack assembly 200 shown in FIG. 6. When viewed from the front (e.g., in FIGS. 5 and 6) the laminated phase module assembly 114 exits to the right of the stack 200, protrudes a certain distance, and ends in the bushings 518, 520 for DC+ and DC− (depending on the ampacity requirements of the system). The phase module assembly 114 can be enclosed inside an exterior housing 600. The housing 600 can protect the phase module assembly 114 against the environment, dust, and other elements. In one embodiment, the second busbar 516 of each of the phase module assemblies 114 may be conductively coupled to each other and/or to the corresponding DC link busbar 202 or 204 that extends across the phase module assemblies 114. For example, the DC link busbar 202, 204 may physically contact each of the second busbars 516. Thus, the direct current may be distributed from the joining busbar 206 to the first busbars 500 of the phase module assemblies 114 along a path that includes both the DC link busbar 202, 204, the capacitors 104, and the second busbars 516 of the phase module assemblies. In an alternative embodiment, the second busbars 516 of the phase module assemblies 114 may be conductively coupled to each other by directly or indirectly physically contacting each other, and the aligned row of coupled busbars 516 may define the corresponding DC link busbar 202, 204 (e.g., without having a discrete DC link busbar that is separate from the second busbars 516). Thus, the direct current may be distributed from the joining busbar 206 to the first busbars 500 of the phase module assemblies 114 along a path that includes just the second busbars 516 and the capacitors 104 (because the second busbars 516 define the DC link busbar 202, 204).

Figure 8:
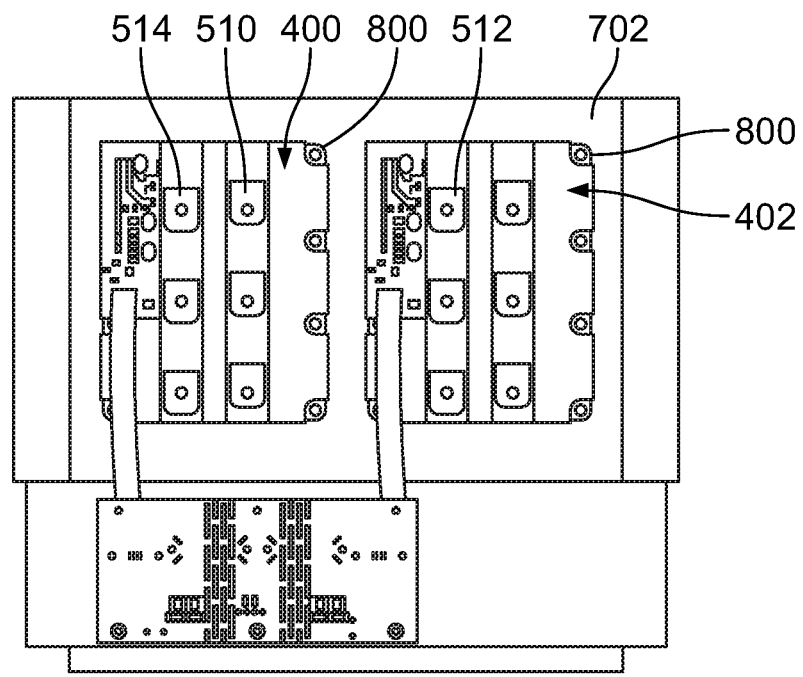
FIG. 8 illustrates a top view of one embodiment of plates of the phase module assembly shown in FIG. 1 connected with a heat sink.
Figure 9:
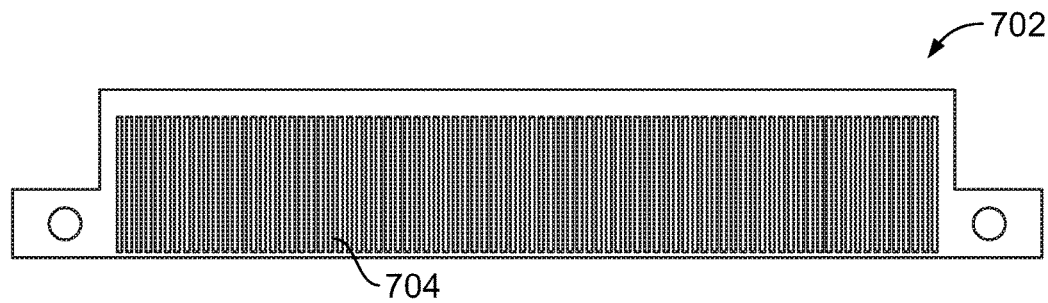
FIG. 9 illustrates a side view of the heat sink shown in FIG. 8.

In one embodiment, the phase module assembly 114 includes or is connected with a heat sink beneath the flat busbar 500 (e.g., in the perspective of FIGS. 5 through 7). FIG. 8 illustrates a top view of one embodiment of the switches 400, 402 of the phase module assembly 114 connected with a heat sink 702. FIG. 9 illustrates a side view of the heat sink 702 shown in FIG. 8. The switches 400, 402 can be IGBTs that are electrically connected to the terminals 512, 510 and the phase module busbar laminations, and are thermally connected through lower baseplates 800 of the switches 400, 402 to the heat sink 702. The baseplates 800 of the switches 400, 402 can be coupled with (e.g., screwed down onto) the heat sink 702.

As shown in FIG. 9, the heat sink 702 includes several spaced-apart fins 704 that allow air to flow between the fins 704 and beneath the phase module assembly 114. In the perspective of FIG. 7, the fins 704 are elongated in up-and-down directions and are spaced apart in lateral or side-to-side directions. Air can enter the heat sink 702 (e.g., enter the spaces between the fins 704) at a back end 706 from a backside plenum and flow through the finned channels in the heat sink 702 toward a front end 708. The fins 704 may direct the air flow in directions perpendicular to the first direction 502 along which the busbar 500 is elongated. The hot air between the fins 704 exits from the front through ducted outputs 710 to the outside of a cabinet where the stack 200 is placed. Seals can be provided to avoid air leaks at the back and front sides where air comes in and goes out. In one embodiment, current flows (or is conducted) in the busbar 500 of the phase module assembly 114 in a direction that is perpendicular (e.g., orthogonal) to the directions in which air flows between the fins 704 in the heat sink 702. The direction of current conduction may be parallel to the first direction 502 of the busbar 500.

The phase module assembly 114 can include an electrical interface that converts or transforms logical control signals from a controller to voltage signals needed to switch on and off the switches 400, 402 with adequate transients (e.g., this provides the functionality of a multi-switch gate driver). In one embodiment, each of the switches 400, 402 can include or represent a gate driver. Each of the switches 400, 402 are disposed side-by-side through interconnecting harnesses that are screwed to control terminals of the switches 400, 402. The switches 400, 402 can receive power supply and logic control signals through fiber optic connectors.

Figure 10:
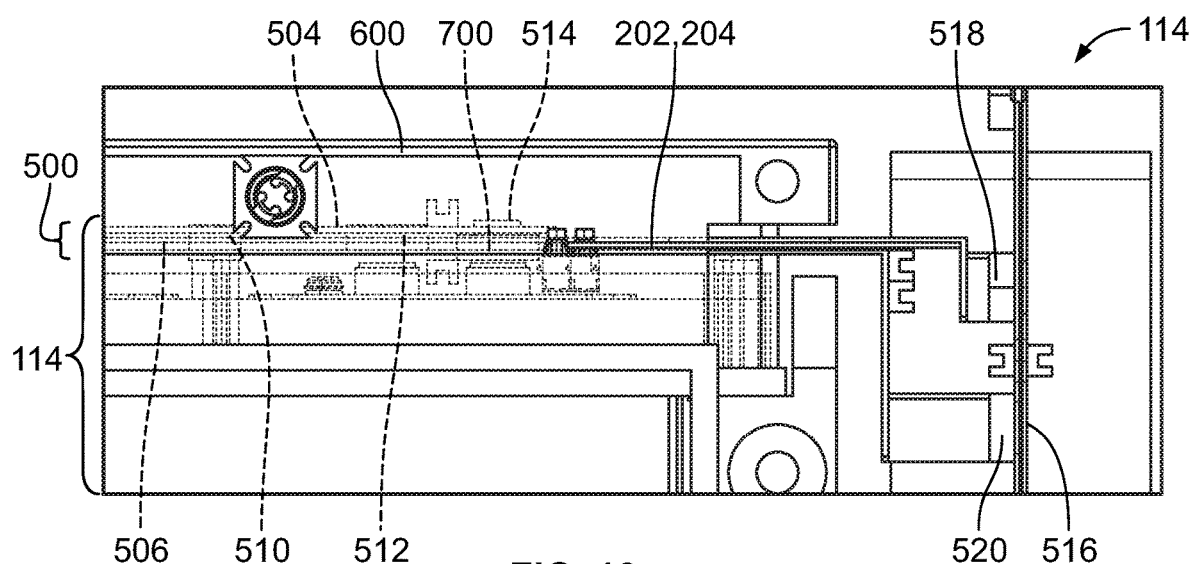
FIG. 10 illustrates a cross-sectional view of one embodiment of the phase module assembly shown in FIG. 1 disposed inside the exterior housing shown in FIG. 6.

FIG. 10 illustrates a cross-sectional view of one embodiment of the phase module assembly 114 disposed inside the exterior housing 600. The phase module assembly 114 can connect with the busbar 202 or 204 described above. For example, the positive layer 506 of the first flat busbar 500 can be conductively coupled with one side of the busbar 202 or 204, and the switches 400, 402 can be conductively coupled with the opposite side of the busbar 202 or 204. The positive internal bushings 510 can conductively couple the positive layer 506 and the positive external bushings 518 with the busbar 202 or 204 to conduct the positive DC being conducted by the busbar 202 or 204. The negative internal bushings 512 can conductively couple the switches 400, 402 and the negative external bushings 520 with the busbar 202 or 204 to conduct the negative DC being conducted by the busbar 202 or 204.

Figure 11:
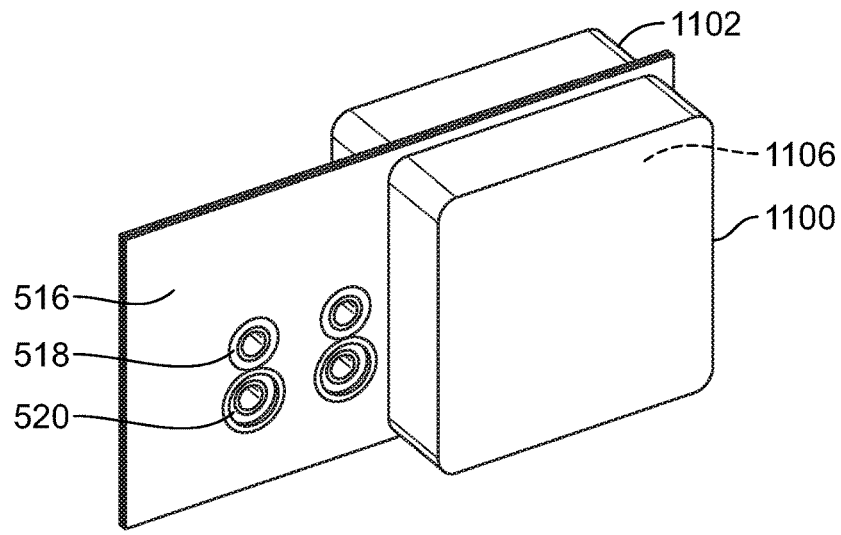
FIG. 11 illustrates a perspective view of a busbar of the phase module assembly according to the embodiment shown in FIG. 5.

The first busbar 500 of the phase module assembly 114 is shaped and positioned to avoid obstruction with capacitors mounted at the back of the second busbar 516 that is coupled to the first busbar 500. FIG. 11 illustrates a perspective view of the second busbar 516 of the phase module assembly 114 according to the embodiment shown in FIG. 5. The side of the busbar 516 shown in FIG. 11 may be the same side of the busbar 516 that is visible in FIGS. 6 and 7, or may be the opposite side. The busbar 516 is configured to conductively couple to the first busbar 500 of the phase module assembly 114 at a portion of the busbar 516 that is spaced apart from the locations of the capacitors mounted on the busbar 516. For example, the first busbar 500 may coupled to the second busbar 516 via the bushings 518, 520 that are disposed along a front portion of the second busbar 516. The capacitors are mechanically mounted to the second busbar 516 along a rear portion of the busbar 516 that is spaced apart from the bushings 518, 520. The capacitors are conductively coupled to the busbar 516. Optionally, the second busbar 516 may be mechanically connected to the respective DC link busbar 202 or 204 at the front portion thereof to avoid obstruction with the capacitors.

The busbar 516 includes two capacitor boxes 1100, 1102 that are mounted along opposite sides of the busbar 516. The two capacitor boxes 1100, 1102 may align with each other along opposite sides of the busbar 516. Each of the capacitor boxes 1100, 1102 houses a respective capacitor 1106 that is directly mounted on and conductively coupled with the second busbar 516. The boxes 1100, 1102 form exterior housings that protect the capacitors 1106 located therein. In an embodiment, the capacitors are solely mechanically supported by the busbar 516. For example, the capacitors may be bolted onto the busbar 516 to rigidly secure the capacitors to the busbar 516. The capacitors may be fully supported by the fasteners without the use of any exterior support members or brackets to support the load of the capacitors that are cantilevered from the busbar 516.

The capacitors 1106 can be low inductance capacitors. The capacitors can be wound foil capacitors or another type of capacitor. The capacitor can be a low inductance capacitor in which the second flat busbar 516 with the capacitor behaves as a commutation capacitor for the switches. For example, for IHM 19×14 modules, 3.3 kV blocking, and four mounted capacitors, each capacitor may be less than 50 nH. Alternatively, the low inductance capacitors may have inductances of less than 50 µH or less than 50 mH.

In one or more embodiments described herein, a phase module assembly integrates lightweight capacitors onto a laminated bus structure to form a direct current link for multiple inverters. An integrated cap busbar interconnects with additional cap busbars to form a chain which creates a modular and scalable structure. The busbar can connect with insulated gate bipolar transistor modules (IGBTs), and multiple busbars can connect end-to-end to form a converter. The phase module assembly includes one or more IGBT in parallel to form one phase of a converter.

In one embodiment, a phase module assembly of a multi-phase inverter is provided. The phase module assembly includes a first flat laminated busbar, one or more switches, and one or more capacitors. The first flat laminated busbar is elongated along a first direction and includes a positive layer, a negative layer, and a load layer that is configured to be conductively coupled with a load. The first flat laminated busbar includes internal positive and negative terminal connectors. The first flat laminated busbar is conductively coupled to a second flat laminated busbar that extends in a plane that is orthogonal to the first direction. The second flat laminated busbar includes external positive and negative bushings configured to be conductively coupled with a power source of direct current. The internal positive and negative terminal connectors are conductively coupled with the external positive and negative bushings via the first and second flat laminated busbars to receive the direct current from the power source. The one or more switches are conductively coupled with the internal positive and negative terminal connectors and configured to convert the direct current into one phase of a multi-phase alternating current of the multi-phase inverter, and to output the phase of the multi-phase alternating current to the load. The one or more capacitors are mechanically mounted on the second flat laminated busbar and conductively coupled with the internal positive and negative terminal connectors and with the external positive and negative bushings.

Optionally, the one or more capacitors are solely mechanically supported by the second flat laminated busbar.

Optionally, the one or more capacitors are one or more low inductance capacitors.

Optionally, the one or more capacitors include a first capacitor mechanically mounted to and extending from a first side of the second flat laminated busbar and a second capacitor mechanically mounted to and extending from a second side of the second flat laminated busbar opposite the first side.

Optionally, the external positive and negative bushings are symmetrically arranged to one side of the one or more capacitors.

Optionally, the external positive and negative bushings of the second flat laminated busbar are conductively coupled to a DC link busbar. The DC link busbar is configured to extend across and conductively couple to at least another phase module assembly.

Optionally, the first flat laminated busbar is horizontally oriented, and the second flat laminated busbar is vertically oriented.

Optionally, the first flat laminated busbar is conductively coupled to a portion of the second flat laminated busbar spaced apart from the one or more capacitors mechanically mounted on the second flat laminated busbar to avoid obstruction between the first flat laminated busbar and the one or more capacitors.

Optionally, the phase module assembly further includes a heat sink. The one or more switches include respective base plates, and the base plates are mechanically coupled to the heat sink. Optionally, the heat sink includes elongated fins arranged to direct airflow between the fins in directions that are perpendicular to the first direction. Optionally the phase module assembly further includes a housing that encloses the first flat laminated busbar, the one or more switches, and the heat sink. The one or more capacitors and the second flat laminated busbar are disposed outside of the housing.

Optionally, the first flat laminated busbar includes a bent tab disposed at an end of the first flat laminated busbar that is opposite of an end of the first flat laminated busbar that is coupled with the second flat laminated busbar. The bent tab is configured to be conductively coupled with the load.

Optionally, the one or more switches are insulated gate bipolar transistors.

Optionally, the load includes one or more of a vehicle brake resistor or a vehicle motor.

In one embodiment, an inverter stack assembly is provided that includes a first multi-phase inverter assembly, a first DC link busbar, a second multi-phase inverter assembly, and a second DC link busbar. The first multi-phase inverter assembly includes multiple phase module assemblies arranged in a stack. The first multi-phase inverter assembly is configured to convert direct current into a multi-phase alternating current and to output the multi-phase alternating current to a load. The first DC link busbar extends across the first multi-phase inverter assembly and is separately conductively coupled to each of the phase module assemblies in the first multi-phase inverter assembly. The first DC link busbar is configured to be conductively coupled to a power source of direct current. The first DC link busbar includes one or more capacitors mechanically mounted thereon and configured to supply the direct current received from the power source to the first multi-phase inverter assembly. The second multi-phase inverter assembly includes multiple phase module assemblies arranged in a stack. The second multi-phase inverter assembly is configured to convert direct current into a multi-phase alternating current and to output the multi-phase alternating current to the load or to another load. The second DC link busbar extends across the second multi-phase inverter assembly and is separately conductively coupled to each of the phase module assemblies in the second multi-phase inverter assembly. The second DC link busbar is configured to be conductively coupled to the power source of direct current. The second DC link busbar includes one or more capacitors mechanically mounted thereon and configured to supply the direct current to the second multi-phase inverter assembly. The first DC link busbar is conductively coupled to the second DC link busbar.

Optionally, each of the phase module assemblies of the first multi-phase inverter assembly includes a first laminated busbar and one or more switches conductively coupled with the first laminated busbar. The one or more switches of each phase module assembly are configured to convert the direct current received from the power source into one corresponding phase of the multi-phase alternating current.

Optionally, the first DC link busbar is conductively coupled to the second DC link busbar via a joining busbar.

Optionally, the inverter stack assembly also includes a bulk capacitor located between the first multi-phase inverter assembly and the second multi-phase inverter assembly. The bulk capacitor is conductively coupled to the first and second DC link busbars.

Optionally, the one or more capacitors mounted on the first DC link busbar are solely mechanically supported by the first DC link busbar.

Optionally, the first DC link busbar and the first multi-phase inverter assembly are vertically disposed above the second DC link busbar and the second multi-phase inverter assembly.

In one embodiment, a multi-phase inverter assembly is provided that includes a first phase module assembly, a second phase module assembly, and a DC link busbar. The DC link busbar extends across the first and second phase module assemblies and separately conductively couples to both the first and second phase module assemblies to supply direct current from a power source to the first and second phase module assemblies. Each of the first and second phase module assemblies includes a first laminated busbar, a second laminated busbar, one or more insulated gate bipolar transistors, and one or more capacitors. The first laminated busbar is elongated along a first direction and is configured to be conductively coupled with a load. The first laminated busbar includes internal terminal connectors. The second laminated busbar is elongated orthogonal to the first direction. The second laminated busbar is conductively coupled to the first flat laminated busbar and is configured to be conductively coupled with the power source such that direct current from the power source is conveyed to the first laminated busbar through the second laminated busbar. The one or more insulated gate bipolar transistors are conductively coupled with the internal terminal connectors of the first laminated busbar. The one or more insulated gate bipolar transistors are configured to convert the direct current received from the power source through the second laminated busbar into one corresponding phase of a multi-phase alternating current, and to output the phase of the multi-phase alternating current to the load through the first laminated busbar. The one or more capacitors are mechanically mounted on and conductively coupled to the second laminated busbar.

Optionally, the first flat laminated busbar is coupled with a heat sink configured to be disposed between the first flat laminated busbar and a switch to which the internal positive and negative terminal connectors are coupled. Optionally, the heat sink includes elongated fins arranged to direct airflow between the fins in directions that are perpendicular to directions in which current is conducted within the positive and negative layers of the first flat laminated busbar.

In one embodiment, a multi-phase inverter assembly includes two or more of the phase modules conductively coupled with the power source to separately receive different portions of the direct current and to separately generate different phases of the multi-phase alternating current for the load. Optionally, the two or more phase modules are coupled with a joining busbar that is configured to be conductively coupled with one or more bulk capacitors and one or more external cables of the power source.

In one embodiment, a multi-phase inverter stack includes the multi-phase inverter assembly, and the joining busbar. In one embodiment, a power supply system includes a plurality of the multi-phase inverter stacks. Optionally, the power supply system also includes an interconnecting lamination coupled with one or more of a top one of the multi-phase inverter assembly of the multi-phase inverter stacks, a bottom one of the multi-phase inverter assembly of the multi-phase inverter stacks, or the joining busbar.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter, including the best mode, and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or operations, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A phase module assembly of a multi-phase inverter, the phase module assembly comprising:
a first flat laminated busbar elongated along a first direction such that the first flat laminated busbar is longer in the first direction than any other direction, the first flat laminated busbar including a positive layer, a negative layer, and a load layer that are electrically conductive, at least partially overlap one another, and are laminated together, the load layer configured to be conductively coupled with a load, the first flat laminated busbar including internal positive and negative terminal connectors, the first flat laminated busbar conductively coupled to a second flat laminated busbar that is oriented transverse to the first direction, the second flat laminated busbar including external positive and negative bushings configured to be conductively coupled with a power source of direct current, wherein the internal positive and negative terminal connectors are conductively coupled with the external positive and negative bushings via the first and second flat laminated busbars to receive the direct current from the power source;
one or more switches conductively coupled with the internal positive and negative terminal connectors and configured to convert the direct current into one phase of a multi-phase alternating current; and
one or more capacitors mechanically mounted on the second flat laminated busbar.

2. The phase module assembly of claim 1, wherein the external positive and negative bushings are symmetrically arranged to one side of the one or more capacitors.

3. The phase module assembly of claim 1, wherein the external positive and negative bushings of the second flat laminated busbar are conductively coupled to a DC link busbar, the DC link busbar configured to extend across and conductively couple to at least another phase module assembly.

4. The phase module assembly of claim 1, wherein the first flat laminated busbar is substantially planar along a first two-dimensional plane, and the second flat laminated busbar is substantially planar along a second two-dimensional plane that is orthogonal to the first two-dimensional plane.

5. The phase module assembly of claim 1, wherein the first flat laminated busbar is conductively coupled to a portion of the second flat laminated busbar spaced apart from the one or more capacitors mechanically mounted on the second flat laminated busbar.

6. The phase module assembly of claim 1, further comprising a heat sink, the one or more switches including respective base plates mechanically coupled to the heat sink.

7. The phase module assembly of claim 6, wherein the heat sink includes elongated fins arranged to direct airflow between the fins in directions that are perpendicular to the first direction.

8. The phase module assembly of claim 6, further comprising a housing that encloses the first flat laminated busbar, the one or more switches, and the heat sink, wherein the one or more capacitors and the second flat laminated busbar are disposed outside of the housing.

9. The phase module assembly of claim 1, wherein the first flat laminated busbar includes a bent tab disposed at an end of the first flat laminated busbar that is opposite of an end of the first flat laminated busbar that is coupled with the second flat laminated busbar, the bent tab configured to be conductively coupled with the load.

10. The phase module assembly of claim 1, wherein the one or more switches are insulated gate bipolar transistors.

11. The phase module assembly of claim 1, wherein the one or more capacitors are solely mechanically supported by the second flat laminated busbar.

12. The phase module assembly of claim 1, wherein the one or more capacitors are one or more low inductance capacitors.

13. The phase module assembly of claim 1, wherein the one or more capacitors include a first capacitor mechanically mounted to and extending from a first side of the second flat laminated busbar and a second capacitor mechanically mounted to and extending from a second side of the second flat laminated busbar opposite the first side.

14. An inverter stack assembly comprising:
a first multi-phase inverter assembly including multiple phase module assemblies arranged in a stack, the first multi-phase inverter assembly configured to convert direct current into a multi-phase alternating current and to output the multi-phase alternating current to a load;
a first DC link busbar extending across the first multi-phase inverter assembly and separately conductively coupled to each of the phase module assemblies in the first multi-phase inverter assembly, the first DC link busbar configured to be conductively coupled to a power source of direct current, the first DC link busbar including one or more capacitors mechanically mounted thereon and configured to supply the direct current received from the power source to the first multi-phase inverter assembly;
a second multi-phase inverter assembly including multiple phase module assemblies arranged in a stack, the second multi-phase inverter assembly configured to convert direct current into a multi-phase alternating current and to output the multi-phase alternating current to the load or to another load;
a second DC link busbar extending across the second multi-phase inverter assembly and separately conductively coupled to each of the phase module assemblies in the second multi-phase inverter assembly, the second DC link busbar configured to be conductively coupled to the power source of direct current, the second DC link busbar including one or more capacitors mechanically mounted thereon and configured to supply the direct current to the second multi-phase inverter assembly; and
a bulk capacitor located between the first multi-phase inverter assembly and the second multi-phase inverter assembly,
wherein the first DC link busbar is conductively coupled to the second DC link busbar and the bulk capacitor is conductively coupled to both the first and second DC link busbars.

15. The inverter stack assembly of claim 14, wherein each of the phase module assemblies of the first multi-phase inverter assembly includes a first laminated busbar and one or more switches conductively coupled with the first laminated busbar, the one or more switches of each phase module assembly configured to convert the direct current received from the power source into one corresponding phase of the multi-phase alternating current.

16. The inverter stack assembly of claim 14, wherein the first DC link busbar is conductively coupled to the second DC link busbar via a joining busbar.

17. The inverter stack assembly of claim 14, wherein the one or more capacitors mounted on the first DC link busbar are solely mechanically supported by the first DC link busbar.

18. The inverter stack assembly of claim 14, wherein the first DC link busbar and the first multi-phase inverter assembly are vertically disposed above the second DC link busbar and the second multi-phase inverter assembly.

19. A multi-phase inverter assembly comprising:
a first phase module assembly;
a second phase module assembly; and
a DC link busbar that extends across the first and second phase module assemblies and separately conductively couples to both the first and second phase module assemblies to supply direct current from a power source to the first and second phase module assemblies, wherein each of the first and second phase module assemblies comprises:
a first laminated busbar elongated along a first direction and configured to be conductively coupled with a load, the first laminated busbar including internal terminal connectors and multiple electrically conductive layers that at least partially overlap one another and are laminated together;
a second laminated busbar oriented transverse to the first laminated busbar, the second laminated busbar conductively coupled to the first laminated busbar, wherein direct current from the power source is conveyed from the DC link busbar through the second laminated busbar to the first laminated busbar;
one or more insulated gate bipolar transistors conductively coupled with the internal terminal connectors of the first laminated busbar, the one or more insulated gate bipolar transistors configured to convert the direct current that is received into one corresponding phase of a multi-phase alternating current, and to output the phase of the multi-phase alternating current to the load through the first laminated busbar; and one or more capacitors mechanically mounted on and conductively coupled to the second laminated busbar.

20. The multi-phase inverter assembly of claim 19, further comprising a bulk capacitor conductively coupled to the DC link busbar and located between the first and second phase module assemblies.

\* \* \* \* \*